US012812885B2

(12) United States Patent
Lin

(10) Patent No.: US 12,812,885 B2
(45) Date of Patent: Nov. 24, 2026

(54) SEMICONDUCTOR DEVICE

(71) Applicant: NATIONAL SUN YAT-SEN UNIVERSITY, Kaohsiung (TW)

(72) Inventor: Jyi-Tsong Lin, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 339 days.

(21) Appl. No.: 18/668,259

(22) Filed: May 20, 2024

(65) Prior Publication Data

US 2025/0040160 A1 Jan. 30, 2025

Related U.S. Application Data

(60) Provisional application No. 63/516,144, filed on Jul. 28, 2023.

(30) Foreign Application Priority Data

Feb. 7, 2024 (TW) ................................ 113104893

(51) Int. Cl.

| | |
|---|---|
| ***H10D 10/00*** | (2025.01) |
| ***H10D 64/23*** | (2025.01) |
| ***H10D 64/62*** | (2025.01) |
| ***H10D 64/64*** | (2025.01) |

(52) U.S. Cl.

CPC ......... *H10D 10/231* (2025.01); *H10D 64/251* (2025.01); *H10D 64/62* (2025.01); *H10D 64/64* (2025.01)

(58) Field of Classification Search

None

See application file for complete search history.

(56) References Cited

U.S. PATENT DOCUMENTS

| | | | | |
|---|---|---|---|---|
| 2017/0365712 | A1* | 12/2017 | Bu | ........................ H10D 12/021 |
| 2020/0098867 | A1* | 3/2020 | Li | ........................ H10D 10/231 |

FOREIGN PATENT DOCUMENTS

| | | |
|---|---|---|
| TW | 202013730 A | 4/2020 |
| TW | M598528 U | 7/2020 |

* cited by examiner

*Primary Examiner* — Bo B Jang
(74) *Attorney, Agent, or Firm* — CKC & Partners Co., LLC

(57) ABSTRACT

A semiconductor device includes a semiconductor layer, a gate structure, a control-source electrode plate, and a drain electrode. The semiconductor layer has a channel region. The gate structure has a surface to contact the semiconductor layer, in which the gate structure overlaps the channel region of the semiconductor layer along a direction perpendicular to the surface of the gate structure. The control-source electrode plate is in contact with the semiconductor layer, in which the control-source electrode plate covers the gate structure and the channel region of the semiconductor layer along the direction perpendicular to the surface of the gate structure. The drain electrode is in contact with the semiconductor layer.

17 Claims, 11 Drawing Sheets

SEMICONDUCTOR DEVICE

CROSS-REFERENCE TO RELATED APPLICATION

This application claims priority to U.S. Provisional Application Ser. No. 63/516,144, filed Jul. 28, 2023, and Taiwan Application Serial Number 113104893, filed Feb. 7, 2024, the disclosures of which are incorporated herein by reference in their entireties.

BACKGROUND

Field of Invention

The present disclosure relates to a semiconductor device.

Description of Related Art

The tunnel field-effect transistor (TFET) is a gate-controlled and reverse-biased PIN diode. TFET has a lower driving current (Ion) and point-tunneling dominant current mechanism. As being easily affected by traps and interfacial traps inside the semiconductor materials, TFET may produce leakage current by the trap-assisted tunneling, which in turn will increase the subthreshold swing. It is hardly to manufacture a conventional TFET device, the subthreshold swing of which is under the 60 mV/Dec, and to apply it on the applications of the low power-supply voltage. In addition, the conventional TFET device is a PIN structure, which requires three different doped regions (namely, requires at least two to three times of the ion implantation techniques and a following annealing technique with the very high thermal budget), and the cost is very high. Besides, the subthreshold swing of the conventional TFET device gets worse easily as the gate bias increases, such that the average of the subthreshold swing may decay obviously and become far above the 60 mV/Dec. In addition, the am-bipolar behavior of the conventional TFET device is severe, and easily occurs early, causing a great amount of the leakage current.

To address the issue regarding the low driving current (Ion) described above, a line tunneling between the different doped semiconductors is used, such as an L-shaped line-tunneling field-effect transistor. The source electrode and the gate area of the L-shaped line-tunneling transistor are both on the same surface of the PIN semiconductor, or the source electrode and the drain electrode of the L-shaped line-tunneling transistor are both on an edge region of the PIN semiconductor. Because line tunneling occurs only between semiconductors of different types or different doping, the probability of line tunneling is too small. Moreover, the doping concentration of the two semiconductor layers in the source region cannot be sufficiently high, also resulting in significantly lower occurrence probabilities of line tunneling. The previous-submitted patent (TWM598528U) uses the inversion layer under the gate and the underlying heavily doped source region to increase the probability of the line tunneling. However, it is unable to produce a uniform and large electric field to assist the line tunneling since the source electrode only adjoins a side edge of the bulk semiconductor, and therefore the occurrence probability of the line tunneling is still not high enough to enlarge the driving current (Ion).

SUMMARY

The purpose of the present disclosure is to provide a semiconductor device which can overcome all the issue encountered by the conventional PIN TFET device and solve the problems faced by the previous line-tunneling structures, such as complexity and difficulty in the fabrication process, a large occupied area, a small region producing the line tunneling, and a low occurrence probability of the line tunneling. In some embodiments of the present disclosure, by making the control-source electrode plate overlap the gate structure along a direction of the gate electric field, the line-tunneling region and the occurrence probability of the line tunneling is enlarged, thereby increasing the driving current (Ion) and lowering the subthreshold swing. In some embodiments of the present disclosure, one of the control-source electrode plate and the drain electrode can also be designed as the Schottky contact, while the other of the control-source electrode plate and the drain electrode can be designed as the Ohmic contact. The configuration of the Schottky contact forms a dopant inductive region in the semiconductor layer, thereby omitting the step of the ion implantation, which in turn will simplify the fabrication process and lowering the cost of the process. In some embodiments of the present disclosure, the charge-enhanced oxide layer also can be designed to lower the contact area of the Schottky contact, thereby avoiding the issue of the fermi-level pinning at a particular location, which in turn will improve the performance of the semiconductor device.

According to some embodiments of the present disclosure, a semiconductor device includes a semiconductor layer, a gate structure, a control-source electrode plate and a drain electrode. The semiconductor layer has a channel region. The gate structure has a surface to contact the semiconductor layer, wherein the gate structure overlaps the channel region of the semiconductor layer along a direction perpendicular to the surface of the gate structure. The control-source electrode plate contacts the semiconductor layer, wherein the control-source electrode plate covers the gate structure and the channel region of the semiconductor layer along the direction perpendicular to the surface of the gate structure. The drain electrode is in contact with the semiconductor layer.

In all embodiments of the present disclosure, the drain electrode does not overlap the gate structure along the direction.

In some embodiments of the present disclosure, one of the control-source electrode plate and the drain electrode forms a Schottky contact with the semiconductor layer, and the other of the control-source electrode plate and the drain electrode forms an Ohmic contact with the semiconductor layer.

In some embodiments of the present disclosure, the semiconductor layer includes a first semiconductor region and a second semiconductor region. The first semiconductor region is adjacent to the control-source electrode plate and the second semiconductor region is adjacent to the drain electrode, wherein the first semiconductor region and the second semiconductor region are of a same conductivity type.

In some embodiments of the present disclosure, the semiconductor layer includes a first semiconductor region and a second semiconductor region. The first semiconductor region is adjacent to the control-source electrode plate and the second semiconductor region is adjacent to the drain electrode, wherein the first semiconductor region and the second semiconductor region are of opposite conductivity types.

In some embodiments of the present disclosure, the semiconductor layer includes a first semiconductor region, a second semiconductor region, a semiconductor pocket layer and a semiconductor pad layer. The first semiconductor region is between the control-source electrode plate and the gate structure. The second semiconductor region is adjacent to the drain electrode. The semiconductor pocket layer is at least between the first semiconductor region and the gate structure. The semiconductor pad layer is at least between the first semiconductor region and the control-source electrode plate, wherein the first semiconductor region, the second semiconductor region, the semiconductor pocket layer and the semiconductor pad layer include the different compositions.

In some embodiments of the present disclosure, the semiconductor layer has a first region and a second region. The first region is between the gate structure and the control-source electrode plate. The second region is adjacent to the drain electrode, and the second region of the semiconductor is not between the gate structure and the control-source electrode plate, wherein the thickness of the second region is less than the thickness of the first region.

In some embodiments of the present disclosure, the control-source electrode plate entirely overlaps the gate structure along the direction.

In some embodiments of the present disclosure, the control-source electrode plate further extends beyond a sidewall of the gate structure.

In some embodiments of the present disclosure, the semiconductor device further includes a charge-enhanced oxide layer. The charge-enhanced oxide layer is between the control-source electrode plate and the semiconductor layer. The control-source electrode plate includes a first control-source electrode and a second control-source electrode. The first control-source electrode of the control-source electrode plate is in contact with the charge-enhanced oxide layer. The second control-source electrode of the control-source electrode plate is not in contact with the charge-enhanced oxide layer. The first control-source electrode is separated from the second control-source electrode.

In some embodiments of the present disclosure, the semiconductor device further includes a charge-enhanced oxide layer. The charge-enhanced oxide layer is between the control-source electrode plate and the semiconductor layer. The control-source electrode plate includes a first control-source electrode and a second control-source electrode. The first control-source electrode of the control-source electrode plate is in contact with the charge-enhanced oxide layer, and the second control-source electrode of the control-source electrode plate is not in contact with the charge-enhanced oxide layer. The first control-source electrode is connected with the second control-source electrode.

In some embodiments of the present disclosure, the semiconductor layer has a first thickness and a second thickness. The first thickness is between the gate structure and the control-source electrode plate. The second thickness is adjacent to the drain electrode, and the first thickness is greater than the second thickness.

In some embodiments of the present disclosure, the gate structure and the drain electrode are on a same surface of the semiconductor layer.

In some embodiments of the present disclosure, the control-source electrode plate and the drain electrode are on opposite surfaces of the semiconductor layer.

In some embodiments of the present disclosure, the semiconductor device further includes a control gate structure. The control gate structure is in contact with a region of the semiconductor layer adjacent to the drain electrode.

In some embodiments of the present disclosure, the control gate structure overlaps the drain electrode along the direction perpendicular to the surface of the gate structure.

According to some embodiments of the present disclosure, a semiconductor device includes a semiconductor layer, a gate structure, a control-source electrode plate, a charge-enhanced oxide layer and a drain electrode. The semiconductor layer has a channel region. The gate structure has a surface to contact the semiconductor layer, wherein the gate structure overlaps the channel region of the semiconductor layer along a direction perpendicular to the surface of the gate structure. The control-source electrode plate contacts the semiconductor layer, wherein the control-source electrode plate covers the gate structure and the channel region of the semiconductor layer along the direction perpendicular to the surface of the gate structure. The charge-enhanced oxide layer is between the control-source electrode plate and the semiconductor layer. The drain electrode is in contact with the semiconductor layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
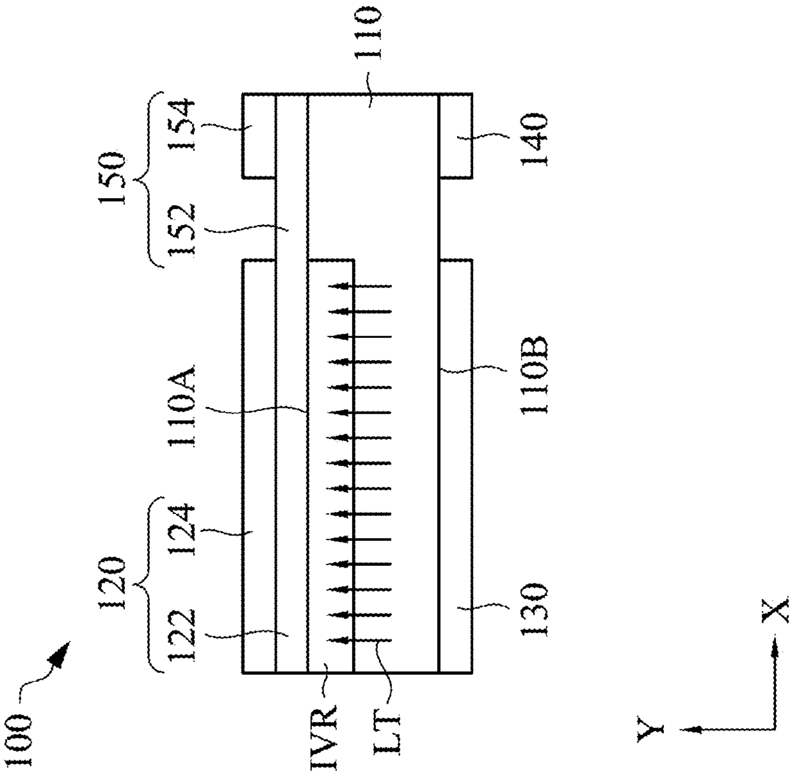
FIG. 1B is an operational schematic diagram of the semiconductor device of FIG. 1A.
Figure 1A:
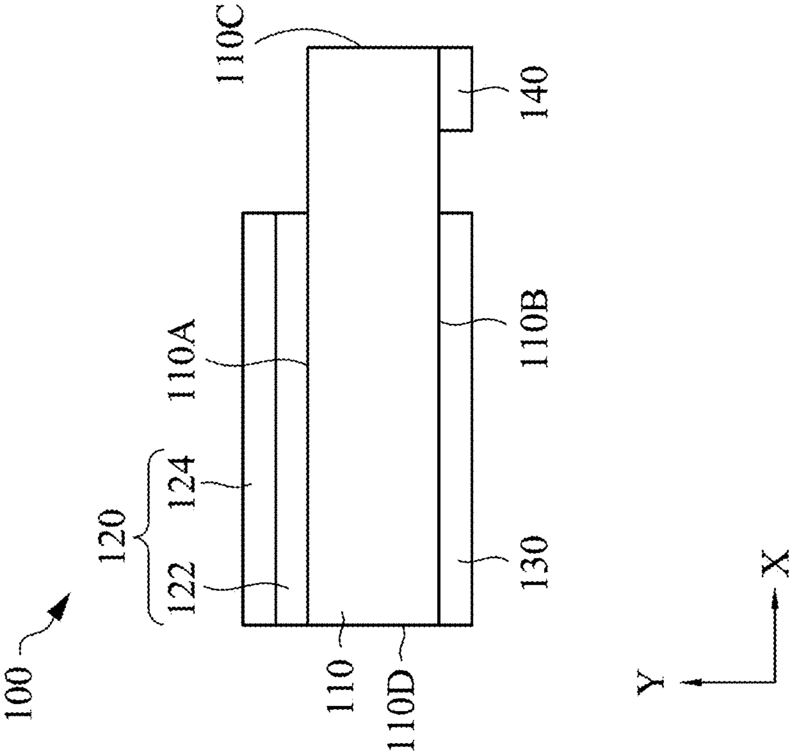
FIG. 1A is a schematic diagram of a semiconductor device in accordance with some embodiments of the present disclosure.

FIG. 1A is a schematic diagram of a semiconductor device in accordance with some embodiments of the present disclosure. The semiconductor device 100 includes a semiconductor layer 110, a gate structure 120, a control-source electrode plate 130 and a drain electrode 140.

The semiconductor layer 110 has a channel region, and the semiconductor layer 110 may include all suitable semiconductor materials, such as silicon, germanium, silicon germanium, oxide semiconductor, group III-V materials, group II-VI materials, two-dimensional semiconductor materials or the combination thereof. The entire semiconductor layer 110 may be a first type semiconductor. The semiconductor layer 110 may be a bulk semiconductor, such as a silicon body and a silicon germanium body. In some embodiments of the present disclosure, the entire semiconductor layer 110 may be a p-type bulk semiconductor, which may be a desired wafer directly purchased or a p-type semiconductor formed by the doping techniques. Alternatively, the semiconductor layer 110 may be an n-type semiconductor formed by doping a p-type bulk semiconductor with n-type dopants. In some embodiments of the present disclosure, the semiconductor layer 110 needs merely once-time doping, which may reduce the steps of the process, reduce the usage frequency of the mask, avoid the issues of the misalignment, and reduce the cost of the process. In addition, the semiconductor layer 110 has a first surface (namely, the surface 110A) and a second surface (namely, the surface 110B) opposite to each other, which may be in contact with the gate structure 120 and the control-source electrode plate 130, respectively.

The gate structure 120 includes a gate dielectric layer 122 and a gate electrode 124. The gate dielectric layer 122 may include any suitable dielectric materials, such as silicon oxide or high-k dielectric material (e.g., hafnium oxide). The gate electrode 124 may include any suitable conductive materials, such as doped polycrystalline silicon or metals.

In the present embodiment, the gate structure 120 and the control-source electrode plate 130 are disposed on the opposite surfaces 110A and 110 B of the semiconductor layer 110 along the direction Y, respectively. The gate structure 120 has a surface to contact the semiconductor layer 110, in which the gate structure 120 overlaps the channel region of the semiconductor layer 110 along the direction perpendicular to the surface of the gate structure 120. The control-source electrode plate 130 contacts the semiconductor layer 110, in which the control-source electrode plate 130 covers the gate structure 120 and the channel region of the semiconductor layer 110 along the direction perpendicular to the surface of the gate structure 120. For convenience of explanation, the direction parallel to the contact surface of the gate structure 120 and the semiconductor layer 110 (namely, surface 110A) is defined as the direction X, and the direction perpendicular to the contact surface of the gate structure 120 and the semiconductor layer 110 (namely, surface 110A) is defined as the direction Y. The direction Y may also be regarded as the direction of the electric field provided by the gate structure 120. In another embodiment, the gate electrode 124 and the control-source electrode plate 130 may have different metallic materials.

In some embodiments, the control-source electrode plate 130 is separated from the gate structure 120 along the direction Y, and the control-source electrode plate 130 covers the gate structure 120 along the direction Y. The control-source electrode plate 130 may partially or entirely overlap the gate structure 120. The edge of the gate electrode 124 may be entirely aligned with the edge of the control-source electrode plate 130 or slightly misaligned with the edge of the control-source electrode plate 130. The control-source electrode plate 130 may be applied a ground voltage or any voltage, not limited by the ground voltage.

The drain electrode 140 may be disposed on a portion of the semiconductor layer 110 away from the control-source electrode plate 130, and the drain electrode 140 may not overlap the gate structure 120 along the direction. In the present embodiment, the drain electrode 140 contacts the surface 110B of the semiconductor layer 110, but the present invention is not limited thereto. The drain electrode 140 may contact all or one to two of the surface 110A, the surface 110B and the side surface 110C of the semiconductor layer 110.

In some embodiments, by designing the work function of the metallic materials and/or the concentration distribution of the semiconductor layer 110, one of the control-source electrode plate 130 and the drain electrode 140 may form an Ohmic contact with the semiconductor layer 110 and the other of the control-source electrode plate 130 and the drain electrode 140 may form a Schottky contact with the semiconductor layer 110.

In some embodiments, the control-source electrode plate 130 and the drain electrode 140 include the same metallic materials, and by designing the doping concentrations of the region of the semiconductor layer 110 adjacent to the control-source electrode plate 130 and the region of the semiconductor layer 110 adjacent to the drain electrode 140 to be different from each other, the Ohmic contact and the Schottky contact may be achieved. For example, the doping concentration of the region of the semiconductor layer 110 adjacent to the Ohmic contact is greater than the doping concentration of the region of the semiconductor layer 110 adjacent to the Schottky contact. In another embodiment, the doping concentrations of the region of the semiconductor layer 110 adjacent to the control-source electrode plate 130 and the region of the semiconductor layer 110 adjacent to the drain electrode 140 are similar to each other, and by designing the control-source electrode plate 130 and the drain electrode 140 including different metallic materials, the Ohmic contact and the Schottky contact may be achieved. For example, when the semiconductor layer 110 is p-type semiconductor, the metallic materials configured to form the Ohmic contact may be Ni, Ir, similar metals or the combination thereof, and the metallic materials configured to form the Schottky contact may be Zr, Mn, Ta, Ti, Sn, Sb, Ru, Os, similar metals or the combination thereof.

Thus, in the present embodiment, the p-type bulk material is used for the semiconductor layer 110. When the p-type bulk material is used as the p-type semiconductor layer 110, the source electrode is designed as the Ohmic contact, and the drain electrode is designed as the Schottky contact, so that the n-type iTFET may be formed. When the p-type bulk material is used for the p-type semiconductor layer 110, the drain electrode is designed as the Ohmic contact and the source electrode is designed as the Schottky contact so that the p-type iTFET may be formed. When the p-type bulk material is used as the n-type semiconductor layer 110 by the n-type doping, the source electrode is designed as the Ohmic contact, and the drain electrode is designed as the Schottky contact, so that the p-type iTFET may be formed. In contrast, when the p-type bulk material is used as the n-type semiconductor layer 110 by the n-type doping, the drain electrode is designed as the Ohmic contact, and the source electrode is designed as the Schottky contact, so that the n-type iTFET may be formed. Thus, the complexity and the cost of the process of the semiconductor device may be reduced significantly.

An impurity-induced region is formed in the semiconductor layer 110 by the Schottky contact between the drain electrode 140 (or the control-source electrode plate 130) and the semiconductor layer 110. For example, an n-type impurity-induced region is formed in the p-type semiconductor layer 110. The impurity-induced region may be referred to as the drain-induced region. The formation of the impurity-induced region does not need any process steps of the ion implantation, thereby reducing the steps and thermal cost of the process, e.g., the thermal annealing process.

FIG. 1B is an operational schematic diagram of the semiconductor device of FIG. 1A. When the gate voltage ($V_G$) applied on the gate electrode 124 is greater than the threshold voltage, the region IVR under the p-type semiconductor layer 110 is inverse to form an n-type channel. By arranging the control-source electrode plate 130 to cover the gate structure 120 along the direction Y, the n-type inverse conductive region IVR produced by the p-type semiconductor layer 110 of the semiconductor device 100 according to the embodiments of the present disclosure has a large overlapping area with the control-source electrode plate 130 along the direction Y, thereby producing the line tunneling while conducting as shown by the arrow LT.

As shown in FIG. 1B, one or more control gate structures 150 may be disposed on a drain region of the semiconductor device 100 according to the functional requirements. The control gate structure 150 may reduce the electric field of the drain electrode 140 and the am-bipolar effect of the semiconductor device 100, thereby lowering the leakage current of the semiconductor device 100. In addition, the control gate structure 150 and the gate structure 120 may be formed by the same fabrication process simultaneously or the different fabrication processes asynchronously. The control gate structure 150 may be disposed on the surface 110A the same as the surface where the gate structure 120 is disposed, or the surface 110B different from the surface where the gate structure 120 is disposed. The control gate structure 150 includes a control gate electrode 154 and a control gate dielectric layer 152. The control gate electrode 154 may overlap and be aligned with the drain electrode 140, or be misaligned with the drain electrode 140. The control gate electrode 154 and the drain electrode 140 may be disposed at the both sides of the bulk semiconductor material simultaneously or asynchronously. The control gate dielectric layer 152 may include any suitable dielectric materials, such as silicon oxide or high-k dielectric materials. The control gate electrode 154 may include any suitable conductive materials, such as doped polycrystalline silicon or metals.

The semiconductor device described above may be any types including horizontal type, vertical type, and three-dimensional type (e.g., fin type). This design may simplify the fabrication process, improve the performance and reduce the cost. For example, in one example, FIG. 1A is a cross-sectional view of a planar induced-TFET (ITFET). In another example, FIG. 1A may be a top view of the fin-type iTFET, while FIG. 1C may be the stereoscopic diagram of the semiconductor device of the FIG. 1A. In the present embodiment, the semiconductor device 100 may be manufactured by following process. For example, a dielectric layer may be deposited on the fins of the semiconductor layer 110, and the dielectric layer is subsequently patterned to form the gate dielectric layer 122 and the control gate dielectric layer 152. Following, a metal layer is deposited on the gate dielectric layer 122, the control gate dielectric layer 152 and the semiconductor layer 110, and the metal layer is then patterned to form the gate electrode 124, the control gate electrode 154, the control-source electrode plate 130 and the drain electrode 140. Thus, in the some embodiments, the gate dielectric layer 122 and the control gate dielectric layer 152 may include the same dielectric materials, and one or more of the gate electrode 124, the control gate electrode 154, the control-source electrode plate 130 and the drain electrode 140 may include the same metallic materials. In some other embodiments, the gate dielectric layer 122 and the control gate dielectric layer 152 may include different dielectric materials, and one or more of the gate electrode 124, the control gate electrode 154, the control-source electrode plate 130 and the drain electrode 140 may include different metallic materials.

Figure 1C:
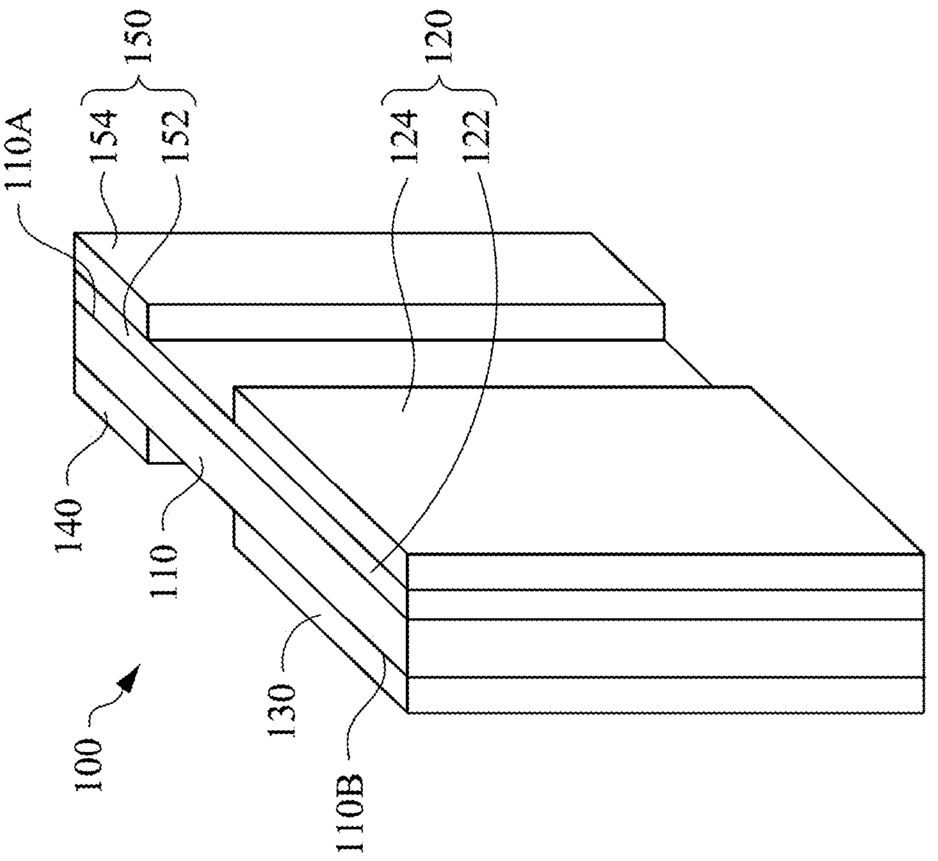
FIG. 1C is a stereoscopic diagram of an example of the semiconductor device of FIG. 1A.
Figure 1D:
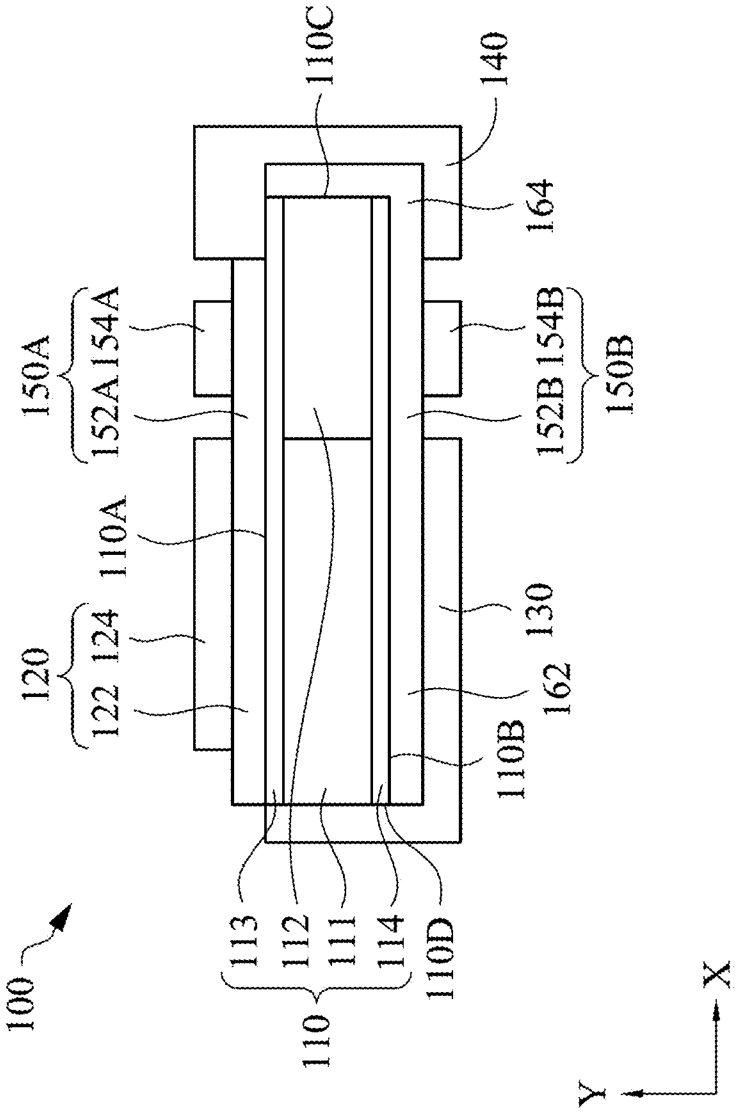
FIG. 1D is a schematic diagram of a semiconductor device in accordance with some embodiments of the present disclosure.

FIG. 1D is a schematic diagram of the semiconductor device 100 in accordance with some embodiments of the present disclosure. In some embodiments, the semiconductor layer 110 may include regions 111, 112, 113 and 114, which may be a combination of the multiple semiconductor materials or constituents. In some embodiments, the regions 111, 112, 113 and 114 are of the same material or constituent, which may be a doped semiconductor material or an intrinsic semiconductor material. In some embodiments, two of the regions 111, 112, 113 and 114 are of the same material or constituent (e.g., a doped semiconductor material or an intrinsic semiconductor material) and different from the material or constituent of the other two of the regions 111, 112, 113 and 114 (e.g., a doped semiconductor material or an intrinsic semiconductor material). In some embodiments, three of the regions 111, 112, 113 and 114 are of the same material or constituent (e.g., a doped semiconductor material or an intrinsic semiconductor material) and different from the material or constituent of the other one of the regions 111, 112, 113 and 114 (e.g., a doped semiconductor material or an intrinsic semiconductor material). In some embodiments, the regions 111, 112, 113 and 114 include different materials or constituents (e.g., a doped-semiconductor material or an intrinsic-semiconductor material), respectively.

For example, in some embodiments, the semiconductor layer 110 may include a first doped semiconductor region and a second doped semiconductor region. The first doped semiconductor region (namely, the region 111) is between the control-source electrode plate 130 and the gate structure 120. The second doped semiconductor region (namely, the region 112) is adjacent to the drain electrode 140, of which the second doped semiconductor region is of a same conductive type as the first doped semiconductor region. In another embodiment, the first doped semiconductor region and the second doped semiconductor region are of opposite conductive types.

For example, in some embodiments, the semiconductor layer 110 may include a first doped semiconductor region, a second doped semiconductor region, a semiconductor pocket layer and a semiconductor pad layer. The first doped semiconductor region (namely, the region 111) is adjacent to the control-source electrode plate 130. The second doped semiconductor region (namely, the region 112) is adjacent to the drain electrode 140. The semiconductor pocket layer (namely, the region 113) is at least between the first doped semiconductor region 111 and the gate structure 120. The semiconductor pad layer (namely, the region 114) is at least between the first doped semiconductor region 111 and the control-source electrode plate 130.

For example, in some embodiments, the semiconductor layer 110 may have a first region (namely, the region 111) between the gate structure 120 and the control-source electrode plate 130. The semiconductor layer 110 may have a second region (namely, the region 112) which is adjacent to the drain electrode 140 and not between the gate structure 120 and the control-source electrode plate 130, in which the thickness of the second region may less than the thickness of the first region.

Furthermore, in the present embodiment, the regions 111 and 112 may be made of semiconductor materials with different energy bandgaps. For example, the region 111 may be made of semiconductor materials with a narrow bandgap and the region 112 may be made of semiconductor materials with a wide bandgap. The pocket layer and the pad layer (i.e., the regions 113 and 114) may be formed by different doping/epitaxy methods. This design may facilitate the formation of the Schottky contact and the Ohmic contact of the source and drain electrode. This design may also further lower the electric field of the drain electrode 140 and reduce the tunneling probability of the point-tunneling (PT), thereby further reducing the leakage current.

In the present embodiment, the control-source electrode plate 130 is disposed on the side surface 110D and the surface 110B, in which the control-source electrode plate 130 overlaps the gate electrode 124 entirely along the direction, and the control-source electrode plate 130 contacts the side surface 110D of the semiconductor layer 110. In some other embodiments, the control-source electrode plate 130 may contact one or all of the side surface 110D and the surface 110B of the semiconductor layer 110. In some other embodiment, the control-source electrode plate 130 further extends beyond the sidewall of the gate structure 120.

In the present embodiment, the drain electrode 140 is disposed on the surface 110A, the surface 110B and the side surface 110C of the semiconductor layer 110, and the drain electrode 140 is in contact with the surface 110A of the semiconductor layer 110. In some other embodiments, the drain electrode 140 may be in contact with one to two or all of the surface 110A, the surface 110B and the side surface 110C.

In the FIG. 1D, same as the configuration shown in FIG. 1B and FIG. 1C, in the present embodiment, the semiconductor device 100 is designed with the control gate structure 150A and the control gate structure 150B. This design may reduce the electric field of the drain electrode 140 and the am-bipolar effect of the semiconductor device 100, thereby lowering the leakage current of the semiconductor device 100.

In addition, the charge-enhanced oxide layer 162 and/or 164 may be disposed on any contact surfaces between the control-source electrode plate 130 and/or the drain electrode 140 and the semiconductor layer 110 according to functional requirements. The charge-enhanced oxide layers 162 and 164 may be the low-k and/or high-k dielectric materials, such as $Si_3N_4$ or suitable oxides. The charge-enhanced oxide layers 162 and 164 may be formed by various deposition techniques (e.g., evaporation or sputter deposition). Thus, the charge-enhanced oxide layers 162 and 164 may reduce the contact area of the control-source electrode plate 130 and the semiconductor layer 110, and the contact area of the drain electrode 140 and the semiconductor layer 110, thereby enhancing the charge concentration of each source and drain electrode. This design may improve the driving current (Ion) of the semiconductor device 100, and also improve and reduce the issue of the fermi-level pinning, thereby increasing the performance of the semiconductor device 100.

Figure 1E:
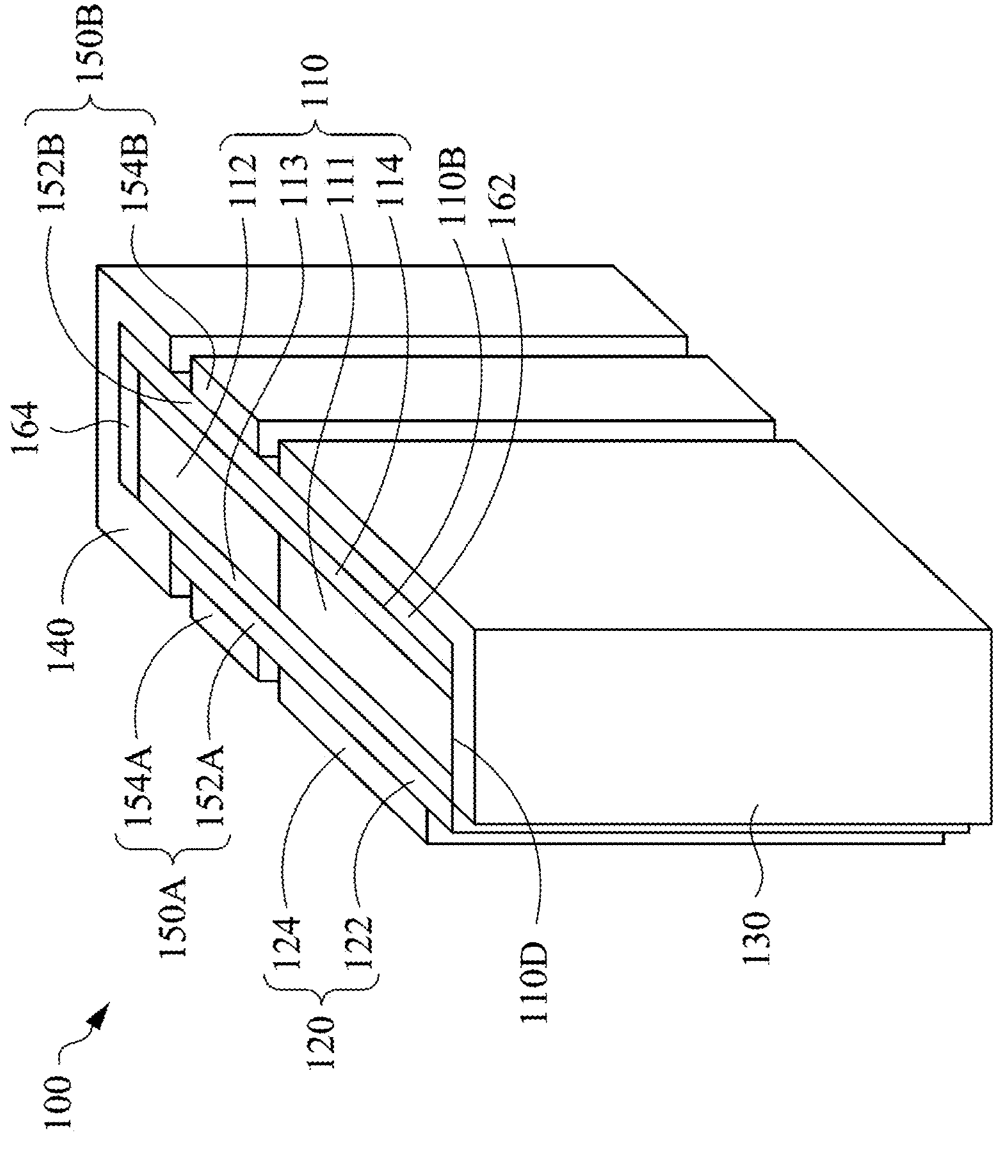
FIG. 1E is a stereoscopic diagram in accordance with an example of the semiconductor device of FIG. 1D.

Same as the FIG. 1A and FIG. 1C, the semiconductor device 100 in FIG. 1D may be any types including horizontal type, vertical type, tree-dimension type (e.g., fin type). This design may simplify the process, improve the performance and reduce the cost. For example, in one example, FIG. 1D is a cross-sectional view of a planar induced-TFET (ITFET). In another example, FIG. 1D may be a top view of the fin-type iTFET, while and FIG. 1E may be the stereoscopic diagram of the semiconductor device of FIG. 1D. The present embodiment is similar to the embodiment of FIG. 1D, except that the semiconductor layer 110 is formed with the regions 111 to 114 through different doping and epitaxy methods according to the functional requirements. Following, a dielectric layer may be deposited on the fin of the semiconductor layer 110, and the dielectric layer is subsequently patterned to form the gate dielectric layer 122, the control gate dielectric layer 152A, the control gate dielectric layer 152B, the charge-enhanced oxide layer 162, and the charge-enhanced oxide layer 164. After that, a metal layer is deposited on the dielectric layer, and the metal later is then patterned to be the gate electrode 124, the control gate electrode 154A, the control gate electrode 154B, the control-source electrode plate 130 and the drain electrode 140.

Figure 1F:
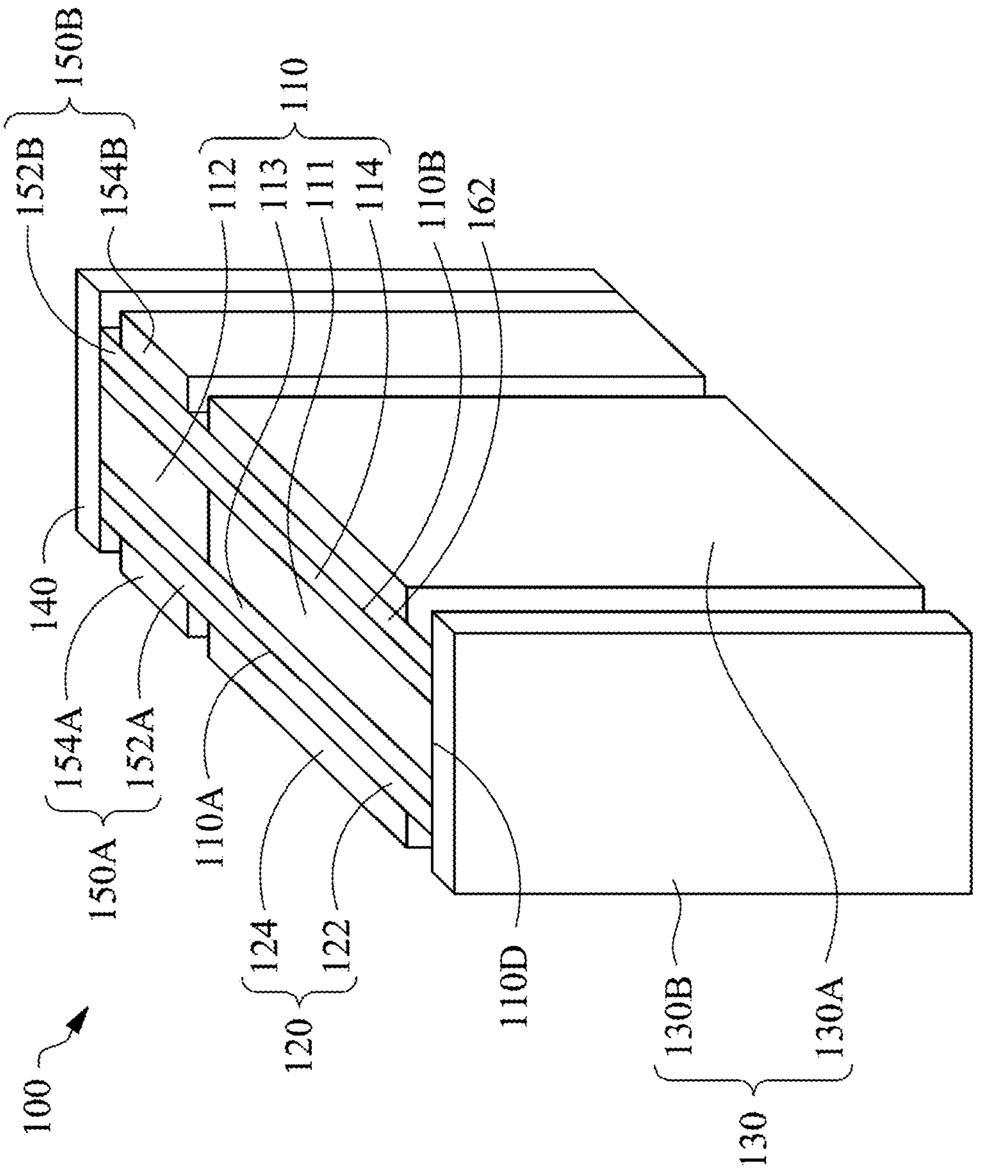
FIG. 1F is a stereoscopic diagram in accordance with an example of the semiconductor device of FIG. 1D.

In another example, FIG. 1F may be the stereoscopic diagram of the semiconductor device of FIG. 1D. The present embodiment is similar to the embodiment of FIG. 1E, except that a dielectric layer may be deposited on the surface 110A and 110B of the semiconductor layer 110 after forming the semiconductor layer 110. Subsequently, a metal layer may be deposited on the dielectric layer. The metal layer is then patterned to form the gate structure 120, the control gate structure 150A, the control gate structure 150B, the control-source electrode plate 130 and the drain electrode 140. The control-source electrode plate 130 includes a first control-source electrode 130A and a second control-source electrode 130B. In the present embodiment, the first control-source electrode 130A may be separated from the second control-source electrode 130B. The first control-source electrode 130A is on the surface 110B of the semiconductor layer 110 and contacts the charge-enhanced oxide layer 162, which is between the first control-source electrode 130A and the semiconductor layer 110. The second control-source electrode 130B is on the surface 110D of the semiconductor layer 110 and does not contact the charge-enhanced oxide layer 162. The first control-source electrode 130A may be a control-source electrode plate, and may be applied a ground voltage or any voltages, not limited to the ground voltage. The second control-source electrode 130B may be a control-source electrode plate, and may be applied a ground voltage or any voltages. In the present embodiment, the surface 110D of the semiconductor layer 110 may not be aligned with the first control-source electrode 130A and the gate structure 120. In addition, in some embodiment, being used as source electrodes, the first control-source electrode 130A and the second control-source electrode 130B may be connected to each other or disconnected from each other according to the functional requirements.

Figure 2:
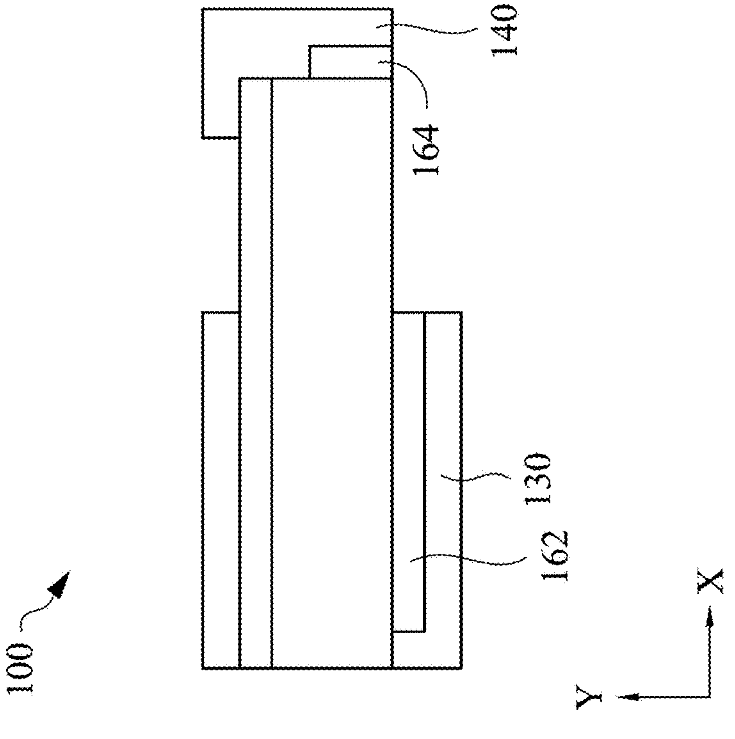
FIG. 2 is a schematic diagram of a semiconductor device in accordance with some embodiments of the present disclosure.

FIG. 2 is a schematic diagram of a semiconductor device in accordance with some embodiments of the present disclosure. As described above, the semiconductor device 100 may include the charge-enhanced oxide layers 162 and/or 164, and the charge-enhanced oxide layers 162 and 164 may be adjusted to have different positions, lengths, and segments according to device requirements. In the present embodiment, a bottom surface 110B of the semiconductor layer 110 is exposed by the charge-enhanced oxide layer 162 so that the control-source electrode plate 130 is in contact with the bottom surface 110B of the semiconductor layer 110. In the present embodiment, the side surface 110C of the semiconductor layer 110 is exposed by the charge-enhanced oxide layer 164, so that the drain electrode 140 is in contact with the side surface 110C of the semiconductor layer 110.

Figure 3:
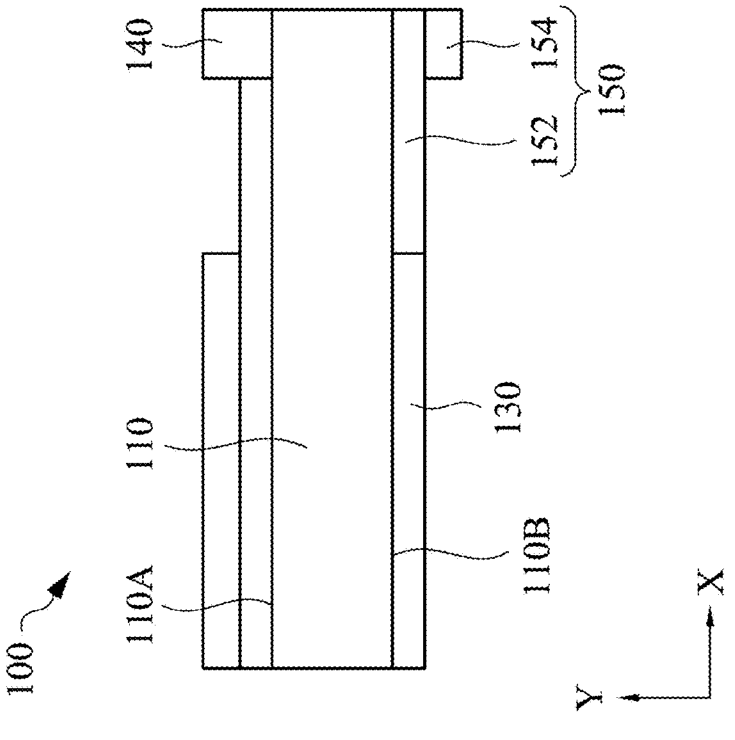
FIG. 3 is a schematic diagram of a semiconductor device in accordance with some embodiments of the present disclosure.

FIG. 3 is a schematic diagram of a semiconductor device in accordance with some embodiments of the present disclosure. As described above, the semiconductor device 100 may include the control gate electrode 154 which may overlap the drain electrode 140 and be aligned or misaligned with the edge of the drain electrode 140. The control gate electrode 154 and the drain electrode 140 may be disposed on the same side or opposite sides of the semiconductor layer 110. In some embodiments, the drain electrode 140 may exchange positions with the control gate structure 150. For example, the drain electrode 140 is on the bottom surface 110B of the semiconductor layer 110 and the control gate structure 150 is on the top surface 110A of the semiconductor layer 110.

Figure 4:
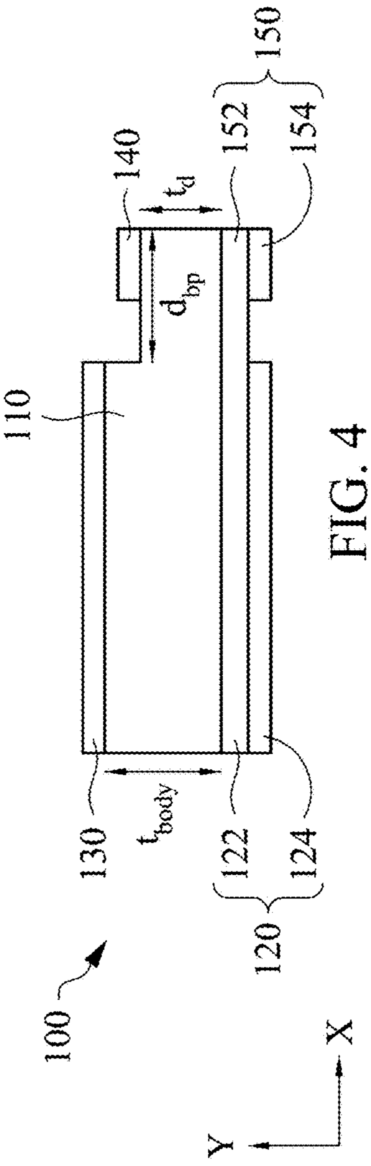
FIG. 4 is a schematic diagram of a semiconductor device in accordance with some embodiments of the present disclosure.

FIG. 4 is a cross sectional view of a semiconductor device 100 in accordance with some embodiments of the present disclosure. The present embodiment is similar to the embodiment of the FIG. 1B, except that an upper portion of the semiconductor layer 110 has a shrunk distance $d_{bp}$ and a thickness $t_{body}$ of the semiconductor layer 110 is greater than the thickness $t_d$. In the FIG. 4, by shrinking an upper portion or a lower portion of the semiconductor layer 110, the semiconductor layer 110 adjacent to the drain electrode 140 but not between the control-source electrode plate 130 and the drain electrode 140 can be thinned. The electric field at the drain electrode may be adjusted by the extent of the thinning (e.g., the value of the thickness ta). Thus, this design may reduce the tunneling probability of the point-tunneling (PT) and further lower the leakage current.

Figure 5:
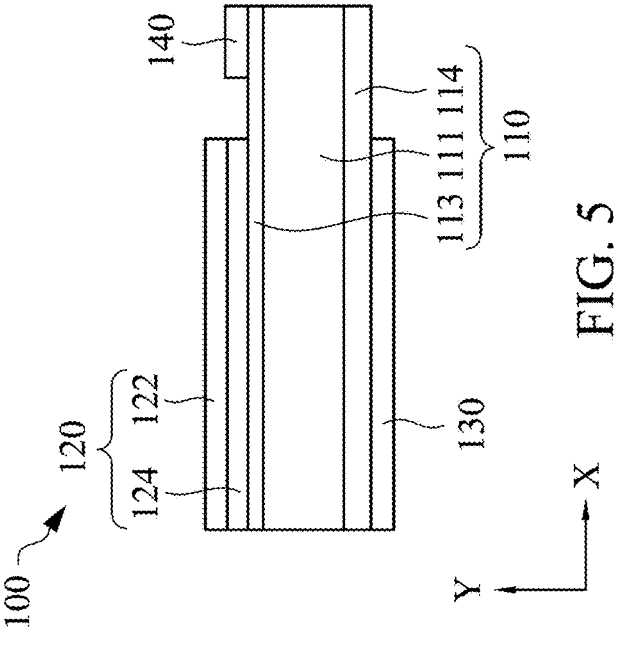
FIG. 5 is a schematic diagram of a semiconductor device in accordance with some embodiments of the present disclosure.

FIG. 5 is a schematic diagram of a semiconductor device 100 in accordance with some embodiments of the present disclosure. In the present embodiment, the semiconductor layer 110 includes the regions 111, 113 and 114. The region 113 may be formed in the region 111 by processing inwards ion implantation, diffusion or other doping changing methods. By outward growing an epitaxial layer, evaporation, sputtering or other methods to outward growing the semiconductor layer, the region 113 may be formed outside the region 111, in which the region 113 may have a same band gap with the region 111 or a different band gap from the region 111, and the region 113 may be doped differently from the region 111 or be an intrinsic semiconductor. Furthermore, the region 114 may be formed in the region 111 by processing inwards ion implantation, diffusion or other doping changing methods. By outward growing the epitaxial layer, evaporation, sputtering or other methods of outward growing the semiconductor layer, the region 114 may be formed outside the region 111, in which the region 114 may have a the same band gap with the region 111, a different band gap from the region 111, and the region 114 may be doped differently from the region 111 or be an intrinsic semiconductor.

The lengths and shapes of the regions 113 and 114 may be adjusted according to the functional requirement. For example, in the present embodiment, the regions 113 and 114 may cover the whole conductive layer. The design may aid the formation and improvement of the Schottky contact and suppress the generation of leakage current. In some other embodiments, the regions 113 and 114 are merely aligned with the overlapping region of the gate structure 120 and the control-source electrode plate 130. This design may be helpful for rapidly producing the carriers of the inversion layer to improve the driving force of the driving current (lon).

Figure 6:
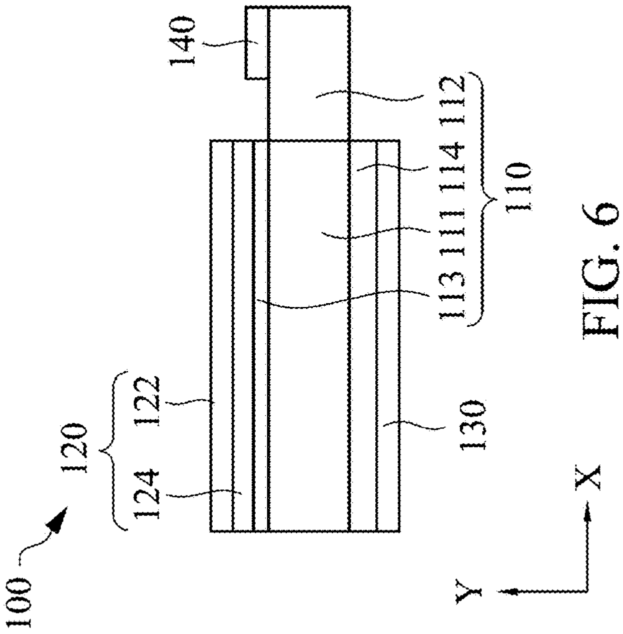
FIG. 6 is a schematic diagram of a semiconductor device in accordance with some embodiments of the present disclosure.

FIG. 6 is a schematic diagram of a semiconductor device in accordance with some embodiments of the present disclosure. The present embodiment is similar to the embodiment of the FIG. 5, except that the semiconductor layer 110 further includes the region 112, which may form a heterojunction with the region 111 in the present embodiment. The regions 111 and 112 which form the region of the heterojunction may be formed by same or different semiconductor materials, and same or different doping techniques or epitaxy, simultaneously or asynchronously.

Figure 7:
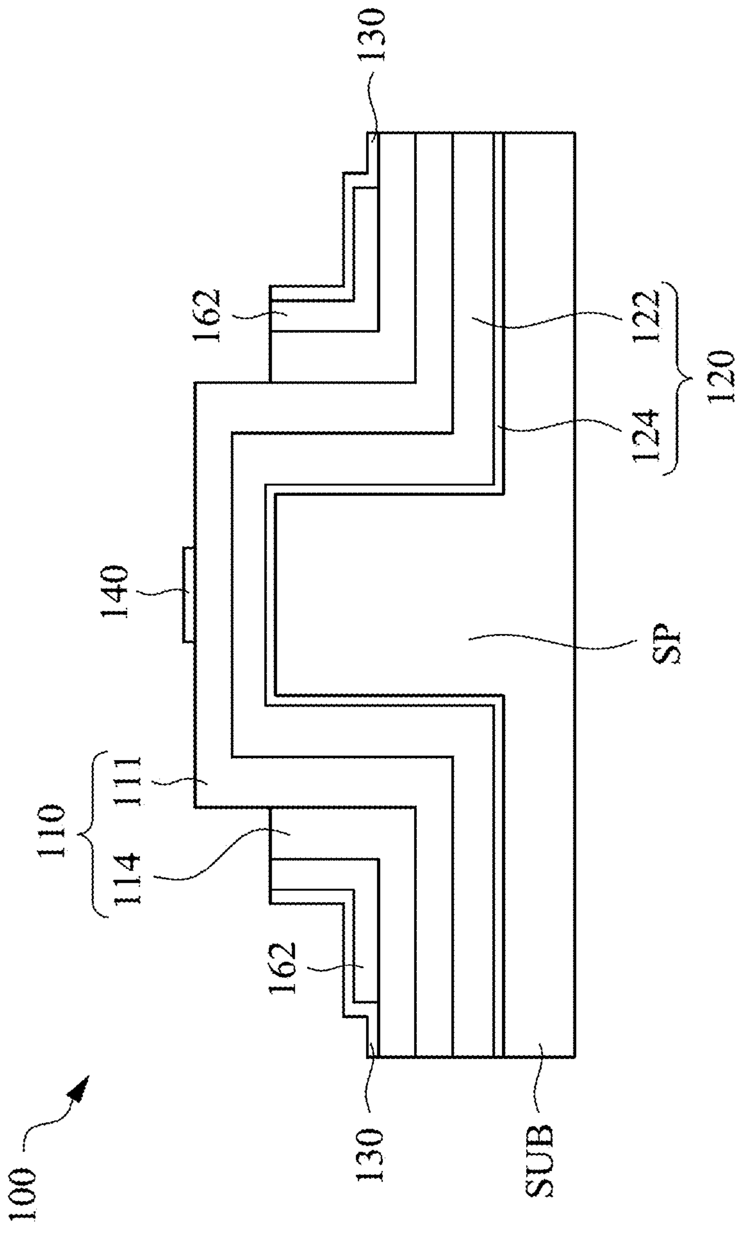
FIG. 7 is a cross-sectional view of a semiconductor device in accordance with some embodiments of the present disclosure.

FIG. 7 is a cross-sectional view of a semiconductor device in accordance with some embodiments of the present disclosure. In the present embodiment the semiconductor substrate SUB may be patterned to form a protruding structure SP. On the semiconductor substrate SUB, the gate electrode 124, the gate dielectric layer 122, the semiconductor layer 110 (including the region 111 and 114) and the charge-enhanced oxide layer 162 may be deposited, respectively. Among them, the region 114 and the charge-enhanced oxide layer 162 may be patterned to expose the region 111. The metallic materials may be deposited, etched or planarized to define the shape of the metallic material, thus forming the control-source electrode plate 130. Similarly, the metallic materials may be deposited, etched or planarized to define the shape of the metallic material, thus forming the drain electrode 140.

FIGS. 8A-8H are cross-sectional views of various stages in the manufacture of a semiconductor device in accordance with some embodiments of the present disclosure.

Figure 8A:
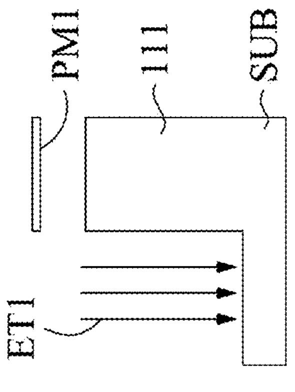
FIGS. 8A-8H are cross-sectional views of various stages in the manufacture of a semiconductor device in accordance with some embodiments of the present disclosure.

In the FIG. 8A, the semiconductor substrate SUB is patterned through the etching process ET1 by using the etching mask PM1 to form a protruding semiconductor region 111. In some embodiments, the semiconductor substrate SUB and the semiconductor region 111 are made of silicon.

Figure 8B:
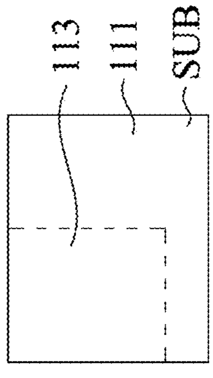

In the FIG. 8B, the region 113 is deposited on the one side of the semiconductor region 111. In some embodiments, the semiconductor region 113 is made of silicon germanium. After the depositing step, a chemical polishing process may be optionally performed to level the top surface of the semiconductor region 113 with the top surface of the semiconductor region 111.

Figure 8C:
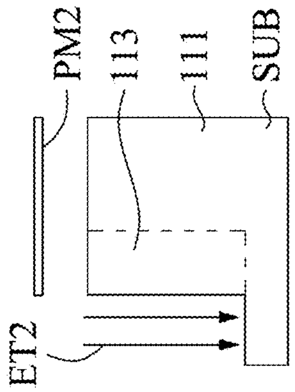

In the FIG. 8C, the semiconductor region 113 is patterned through the etching process ET2 by using the etching mask PM2.

Figure 8D:
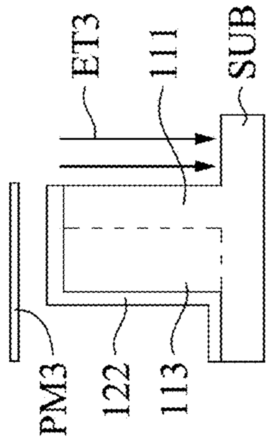

In the FIG. 8D, the gate dielectric layer 122 is deposited, and the gate dielectric layer 122 and the semiconductor region 111 are patterned through the etching process ET3 by using the etching mask PM3.

Figure 8E:
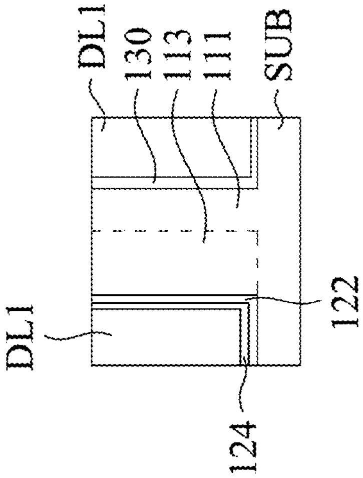

In the FIG. 8E, a metallic layer is deposited on the gate dielectric layer 122, and then a dielectric layer DL1 is deposited thereon. Following, a chemical polishing process is performed to remove the higher portion of the metallic layer, and lower portions of the metallic layer form the gate electrode 124 and the control-source electrode plate 130, respectively.

Figure 8F:
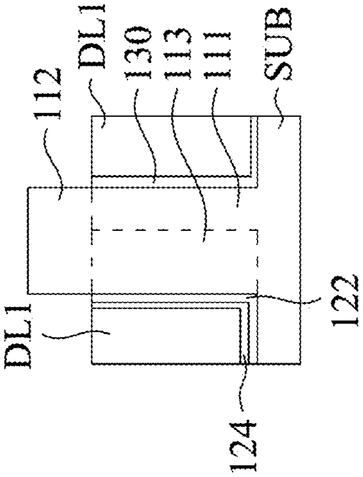

In the FIG. 8F, the semiconductor region 112 is selectively epitaxially grown on the semiconductor regions 111 and 113.

Figure 8G:
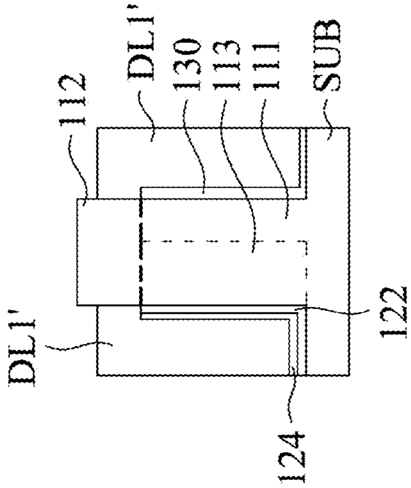

In the FIG. 8G, a dielectric layer is deposited and etched to expose the semiconductor region 112. After the etching process, a combination of the dielectric layer and the dielectric layer DL1 (refer to the FIG. 8F) is called the dielectric layer DL1'.

Figure 8H:
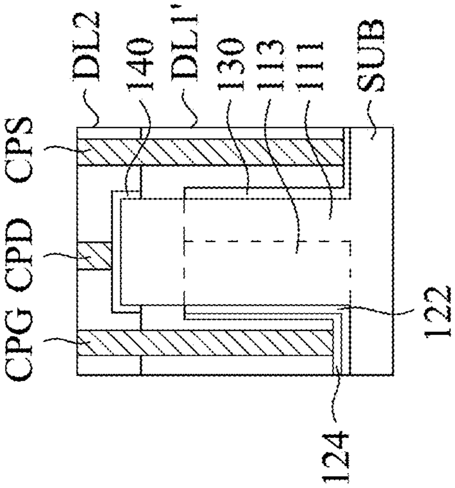

In the FIG. 8H, the drain electrode 140 is deposited to contact the exposed semiconductor region 112. Following, a dielectric layer DL2 is deposited, and multiple contact openings are etched in the dielectric layer DL2. Subsequently, metallic materials are deposited into these contact openings and a chemical polishing process is performed to form the gate contact CPG, the drain contact CPD and the source contact CPS which are electrically connected to the gate electrode 124, the drain electrode 140 and the control-source electrode plate 130, respectively.

Figure 9:
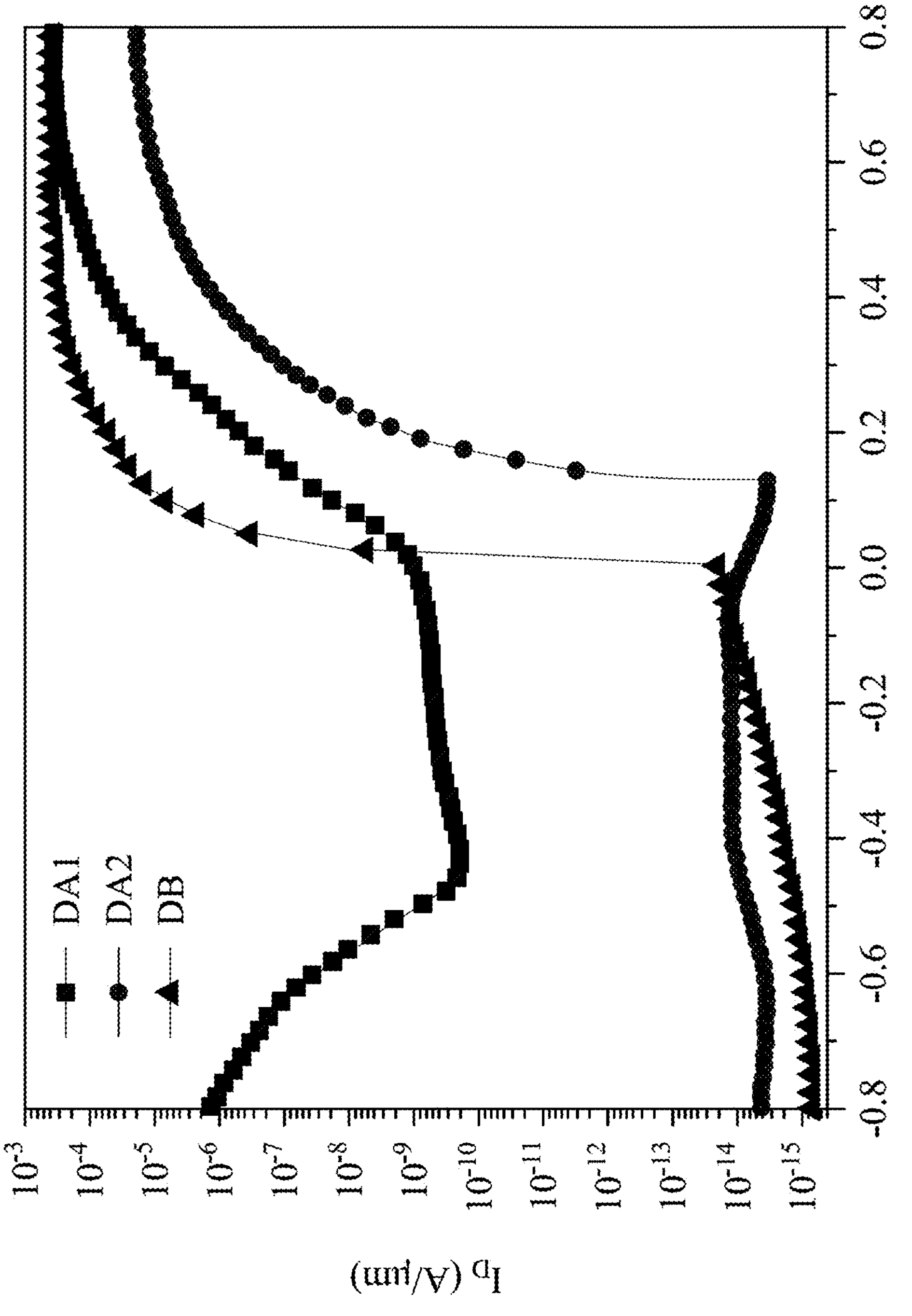
FIG. 9 is a diagram of a gate voltage versus a drain voltage of a semiconductor device in accordance with some embodiments of the present disclosure.

FIG. 9 is a diagram of a gate voltage versus a drain voltage of a semiconductor device 100 (e.g., FIG. 1D) in accordance with some embodiments of the present disclosure. In various embodiments of the present disclosure, the semiconductor device 100 may adopt a homogeneous structure or a heterogeneous structure as the semiconductor layer 110. For example, the semiconductor device DA1 adopts the Ge homogeneous structure as the semiconductor layer 110, and the semiconductor device DA2 adopts the GaAs homogeneous structure as the semiconductor layer 110, and the semiconductor device DB adopts the Ge/GaAs heterogeneous structure as the semiconductor layer 110. As shown in FIG. 9, compared to the semiconductor devices DA1 and DA2 with the homogeneous structure, the semiconductor device DB with the heterogeneous structure may have lowered Ioff (to the $2.63\times10^{-14}$ A/um) and suppressed the an-bipolar effect current while maintaining the high conductive current state. The efficacy described above may be further boosted by the design of the heterojunction.

The purpose of the present disclosure is to provide a semiconductor device which can overcome all the issue encountered by the conventional PIN TFET device and solve the problems faced by the previous line-tunneling structures, such as complexity and difficulty in the fabrication process, a large occupied area, a small region producing the line tunneling, and a low occurrence probability of the line tunneling. In some embodiments of the present disclosure, by making the control-source electrode plate overlap the gate structure along a direction of the gate electric field, the line-tunneling region and the occurrence probability of the line tunneling is enlarged, thereby increasing the driving current (lon) and lowering the subthreshold swing. In some embodiments of the present disclosure, one of the control-source electrode plate and the drain electrode can also be designed as the Schottky contact, while the other of the control-source electrode plate and the drain electrode can be designed as the Ohmic contact. The configuration of the Schottky contact forms a dopant inductive region in the semiconductor layer, thereby omitting the step of the ion implantation, which in turn will simplify the fabrication process and lowering the cost of the process. In some embodiments of the present disclosure, the charge-enhanced oxide layer also can be designed to lower the contact area of the Schottky contact, thereby avoiding the issue of the fermi-level pinning at a particular location, which in turn will improve the performance of the semiconductor device.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- a semiconductor layer, having a channel region;
- a gate structure, having a surface to contact the semiconductor layer, wherein the gate structure overlaps the channel region of the semiconductor layer along a direction perpendicular to the surface of the gate structure;
- a control-source electrode plate comprising a metallic material, wherein the control-source electrode plate is in contact with the semiconductor layer and covers the gate structure and the channel region of the semiconductor layer along the direction perpendicular to the surface of the gate structure; and
- a drain electrode in contact with the semiconductor layer.

2. The semiconductor device of claim 1, wherein the drain electrode does not overlap the gate structure along the direction.

3. The semiconductor device of claim 1, wherein one of the control-source electrode plate and the drain electrode forms a Schottky contact with the semiconductor layer, and the other of the control-source electrode plate and the drain electrode forms an Ohmic contact with the semiconductor layer.

4. The semiconductor device of claim 1, wherein the semiconductor layer comprises:
- a first semiconductor region adjacent to the control-source electrode plate; and
- a second semiconductor region adjacent to the drain electrode, wherein the first semiconductor region and the second semiconductor region are of a same conductivity type.

5. The semiconductor device of claim 1, wherein the semiconductor layer comprises:
- a first semiconductor region adjacent to the control-source electrode plate; and
- a second semiconductor region adjacent to the drain electrode, wherein the first semiconductor region and the second semiconductor region are of opposite conductivity types.

6. The semiconductor device of claim 1, wherein the semiconductor layer comprises:
- a first semiconductor region between the control-source electrode plate and the gate structure;
- a second semiconductor region adjacent to the drain electrode;
- a semiconductor pocket layer at least between the first semiconductor region and the gate structure; and
- a semiconductor pad layer at least between the first semiconductor region and the control-source electrode plate, wherein the first semiconductor region, the second semiconductor region, the semiconductor pocket layer and the semiconductor pad layer comprise different compositions.

7. The semiconductor device of claim 1, wherein the semiconductor layer has a first region between the gate structure and the control-source electrode plate and a second region adjacent to the drain electrode, the second region of the semiconductor layer being not between the gate structure and the control-source electrode plate, wherein a thickness of the second region is less than a thickness of the first region.

8. The semiconductor device of claim 1, wherein the control-source electrode plate entirely overlaps the gate structure along the direction.

9. The semiconductor device of claim 1, wherein the control-source electrode plate further extends beyond a sidewall of the gate structure.

10. The semiconductor device of claim 1, further comprising:

a charge-enhanced oxide layer between the control-source electrode plate and the semiconductor layer, wherein the control-source electrode plate comprises a first control-source electrode and a second control-source electrode, the first control-source electrode of the control-source electrode plate is in contact with the charge-enhanced oxide layer, the second control-source electrode of the control-source electrode plate is not in contact with the charge-enhanced oxide layer, and the first control-source electrode is separated from the second control-source electrode.

11. The semiconductor device of claim 1, further comprising:

a charge-enhanced oxide layer between the control-source electrode plate and the semiconductor layer, wherein the control-source electrode plate comprises a first control-source electrode and a second control-source electrode, the first control-source electrode of the control-source electrode plate is in contact with the charge-enhanced oxide layer, the second control-source electrode of the control-source electrode plate is not in contact with the charge-enhanced oxide layer, and the first control-source electrode is connected with the second control-source electrode.

12. The semiconductor device of claim 1, wherein the semiconductor layer has a first thickness between the gate structure and the control-source electrode plate and a second thickness adjacent to the drain electrode, and the first thickness is greater than the second thickness.

13. The semiconductor device of claim 1, wherein the gate structure and the drain electrode are on a same surface of the semiconductor layer.

14. The semiconductor device of claim 1, wherein the control-source electrode plate and the drain electrode are on opposite surfaces of the semiconductor layer.

15. The semiconductor device of claim 1, further comprising a control gate structure in contact with a region of the semiconductor layer adjacent to the drain electrode.

16. The semiconductor device of claim 15, wherein the control gate structure overlaps the drain electrode along the direction perpendicular to the surface of the gate structure.

17. A semiconductor device, comprising:

a semiconductor layer, having a channel region;

a gate structure, having a surface to contact the semiconductor layer, wherein the gate structure overlaps the channel region of the semiconductor layer along a direction perpendicular to the surface of the gate structure;

a control-source electrode plate in contact with the semiconductor layer, wherein the control-source electrode plate covers the gate structure and the channel region of the semiconductor layer along the direction perpendicular to the surface of the gate structure;

a charge-enhanced oxide layer between the control-source electrode plate and the semiconductor layer; and a drain electrode in contact with the semiconductor layer.

* * * * *